United States Patent
Riel et al.

(10) Patent No.: US 10,573,381 B2
(45) Date of Patent: Feb. 25, 2020

(54) DEVICE COMPRISING POLYMORPHIC RESISTIVE CELLS

(71) Applicant: International Business Machines Corporation, Armonk, NY (US)

(72) Inventors: Heike E. Riel, Baech (CH); Aakash Pushp, Santa Clara, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/043,254

(22) Filed: Jul. 24, 2018

(65) Prior Publication Data

US 2020/0035296 A1  Jan. 30, 2020

(51) Int. Cl.
  *G11C 11/00* (2006.01)
  *G11C 13/00* (2006.01)
  *H01L 45/00* (2006.01)
  *G06N 3/04* (2006.01)

(52) U.S. Cl.
  CPC .......... *G11C 13/0004* (2013.01); *G06N 3/04* (2013.01); *G11C 13/004* (2013.01); *G11C 13/0069* (2013.01); *H01L 45/06* (2013.01); *H01L 45/1253* (2013.01); *G11C 2013/0045* (2013.01); *G11C 2013/0078* (2013.01)

(58) Field of Classification Search
  CPC .......... G11C 13/0004; G11C 13/0007; G11C 2213/31; G11C 2213/32; G11C 13/003; G11C 2213/75; G11C 2213/15; G11C 13/0033; G11C 13/004; G11C 13/0069; G11C 16/3431; G11C 2013/0052; G11C 2013/0078; G11C 2013/009; G11C 2013/0092
  See application file for complete search history.

(56) References Cited

U.S. PATENT DOCUMENTS

| 8,149,608 B2 | 4/2012 | Lee |
| 8,415,226 B2 | 4/2013 | Kochupurackal et al. |
| 9,496,490 B2 | 11/2016 | Boeve et al. |
| 2010/0157656 A1* | 6/2010 | Tsuchida ............ G11C 8/08 365/148 |
| 2016/0049582 A1 | 2/2016 | Kim et al. |

OTHER PUBLICATIONS

Kawakami, K., "Reversibility of Enantiotropically Related Polymorphic Transformations from a Practical Viewpoint: Thermal Analysis of Kinetically Reversible/Irreversible Polymorphic Transformations", Journal of Pharmaceutical Sciences, May 2007, pp. 982-989, vol. 96, No. 5.

Tanaka, K., et al., "Amorphous Chalcogenide Semiconductors and Related Materials", Springer Science+Business Media, LLC 2011, First online Apr. 20, 2011, https://link.springer.com/book/10.1007%2f978-1-4419-9510-0#about, Accessed on Jul. 24, 2018, 2 pages.

* cited by examiner

*Primary Examiner* — Thong Q Le

(74) *Attorney, Agent, or Firm* — Scully, Scott, Murphy & Presser, P.C.; Daniel P. Morris, Esq.

(57) ABSTRACT

A device comprising a control unit and a plurality of resistive cells. The plurality of resistive cells each comprises a first terminal, a second terminal and a polymorphic layer comprising a polymorphic material. The polymorphic layer is configured to form a tunnel barrier. The polymorphic layer is arranged between the first terminal and the second terminal. The first terminal, the second terminal and the polymorphic layer form a tunnel junction.

20 Claims, 4 Drawing Sheets

DEVICE COMPRISING POLYMORPHIC RESISTIVE CELLS

BACKGROUND

The present disclosure is directed to a device comprising a control unit and a plurality of resistive cells, in particular a resistive memory device comprising a plurality of resistive memory cells. The disclosure further concerns a related method and a related computer program product.

One example for resistive memory devices is phase-change memory (PCM) devices. PCM is a non-volatile solid-state memory technology that exploits the reversible, thermally-assisted switching of phase-change materials, in particular chalcogenide compounds such as GST (Germanium-Antimony-Tellurium), between states with different electrical resistance. The fundamental storage unit (the "cell") can be programmed into a number of different states, or levels, which exhibit different resistance characteristics. The s programmable cell-states can be used to represent different data values, permitting storage of information.

Reading and writing of data in PCM cells is achieved by applying appropriate voltages to the phase-change material via a pair of electrodes associated with each cell. In a write operation, the resulting programming signal causes Joule heating of the phase-change material to an appropriate temperature to induce the desired cell-state on cooling. Reading of PCM cells is performed using cell resistance as a metric for cell-state. An applied read voltage causes current to flow through the cell, this current being dependent on the resistance of the cell. Measurement of the cell current therefore provides an indication of the programmed cell state. A sufficiently low read voltage is used for this resistance metric to ensure that application of the read voltage does not disturb the programmed cell state. Cell state detection can then be performed by comparing the resistance metric with predefined reference levels for the s programmable cell-states.

One of the major problems with the existing Phase Change Memory is that the material that is currently used in the memory cell of a PCM changes its phase from a high resistance amorphous to a low resistance crystalline state. Although the crystalline state is stable in time, the amorphous state is continually evolving thereby making the resistance of the high resistance state to not stay well defined, but to evolve/drift in time. Accordingly, there is a need for other memory devices.

SUMMARY

According to a first aspect, the invention is embodied as a device comprising a control unit and a plurality of resistive cells. The plurality of resistive cells each comprises a first terminal, a second terminal and a polymorphic layer comprising a polymorphic material. The polymorphic layer is configured to form a tunnel barrier. The polymorphic layer is arranged between the first terminal and the second terminal. The first terminal, the second terminal and the polymorphic layer form a tunnel junction.

According to an embodiment, the polymorphic layer is configured to exhibit a first crystalline form and a second crystalline form. The first crystalline form has a first resistance state and the second crystalline form has a second resistance state.

Such an embodied device may be reversibly switched between the first crystalline form and the second crystalline form. According to embodiments the two crystal structures of the first crystalline form and the second crystalline form have well defined minima in the free energy. Hence according to embodiments the lattice corresponding to the first crystal form and the second crystal form is stable and does not evolve in time. Hence according to embodiments of the invention the first crystal form and the second crystal form and its corresponding resistance states do not show any drift.

According to embodiments of the invention, the stoichiometry of the polymorphic material of the polymorphic layer is fixed, just its crystalline form or in other words its crystalline state is changed, but not the chemical composition of the polymorphic layer.

Furthermore, according to embodiments the band gap of the polymorphic material is different in the first crystalline form and the second crystalline form. This implies that for the tunnel junction, which is formed by the first terminal, the second terminal and the polymorphic material of the polymorphic layer, the tunnel resistance across the tunnel junction is different. This allows to program the device to different resistance states.

According to an embodiment, the control unit is configured to apply heat to the resistive cells in order to switch interchangeably between the first and the second crystalline form and its corresponding first and second resistance state. According to embodiments the heat may be applied directly to the resistive cells or indirectly by an electrical current. According to embodiments electrical current and heat may be also applied in combination.

According to an embodiment, the control unit is configured to switch enantiotropically between the first and the second crystalline form and its corresponding first and second resistance state.

Such enantiotropic systems allow reversible transitions from one crystalline form to another crystalline form below the melting points. More particularly, for such an enantiotropic system, a plot of the free energy against temperature shows a crossing point threshold before the various melting points. Accordingly, this allows the design of devices according to embodiments of the invention which revert interchangeably between the first crystalline form and the second crystalline form by heating or cooling, or 'through physical contact with a lower energy polymorphic material.

According to an embodiment, the polymorphic material is configured to show a kinetically irreversible transition between the first and the second crystalline form.

With such polymorphic materials the stable enantiotropic form at higher temperature is available even below the thermodynamic temperature and vice versa.

According to an embodiment, at least one of the first terminal and the second terminal is epitaxially lattice matched to the polymorphic layer in the first crystalline form or the second crystalline form.

This facilitates on the one hand the fabrication of the resistive cells. More particularly, the polymorphic layer may be grown by epitaxy on the bottom terminal, e.g. on the second terminal. Furthermore, it provides a kind of bias of the crystalline form of the polymorphic layer towards the crystalline form of the bottom terminal.

According to an embodiment, the first terminal and the second terminal are embodied as metallic electrodes comprising a metal. The metal of the lower, e.g. the second metallic electrode, may be in particular a metallic oxide, e.g. $IrO_2$ or $RuO_2$. The metal of the other, e.g. the first metallic electrode may be any metal, e.g. platinum.

According to an embodiment, the polymorphic material is a metal oxide, in particular a binary metal oxide.

According to embodiments, the binary metal oxide is selected from the group consisting of: CrO2, Cr2O3, Fe2O3, Al2O3, Bi2O3, TiO2, SnO2, ZrO2, MoO3, WO3, In2O3 and mixtures thereof.

Such metal oxides have multiple well-defined crystal structures that can be accessed as a function of temperature and/or pressure, i.e., by growing the polymorphic material under strain from the second terminal, or during operation by controlling the heat dissipation.

According to an embodiment, the control unit is configured to apply in a write mode electrical programming pulses to the first terminal and the second terminal for writing a resistance state of the cells.

According to an embodiment, the electrical programming pulses comprise RESET pulses to perform a transition from the first crystalline form to the second crystalline form and SET-pulses to perform a transition from the second crystalline form to the first crystalline form.

The trailing edge of the RESET-pulses is chosen such that the associated quench-rate is sufficiently high to create the second crystalline form and to prevent the reformation of the first crystalline form. Such a quick quenching avoids that the polymorphic material may go back to the first crystalline state which has a lower Gibbs free energy.

According to an embodiment, the device is configured to apply in a read mode a read voltage to the first and the second terminal for reading a resistance state of the cells.

According to an embodiment, the device is configured to shift a domain wall between the first crystalline form and the second crystalline form in order to tune a resistance state of the cells in a continuous manner. This allows to continuously tune the resistance of the device. In particular, this facilitates multi-level memory operations.

According to an embodiment, the polymorphic layer has a thickness of less than 20 nm.

Such a thin polymorphic layer facilitates a reversible switching between the two crystalline forms of the polymorphic material. Furthermore, it may lower the transition temperature of the polymorphic material between the first and the second crystalline state compared with a thicker polymorphic layer.

According to embodiments, the reversible switching may be further facilitated by a proper choice of underlayers, in particular the bottom terminal/second terminal. More particularly, by growing a thin tunnel barrier on the bottom terminal, interface effects may be appropriately used by increasing strain from the bottom terminal, for example, and by increasing the surface/volume ratio.

According to an embodiment, the device is a memory device.

According to another embodiment, a neuromorphic network comprising a device according to the first aspect is provided. The devices according to embodiments of the invention may form in particular synapses of the neuromorphic network.

According to an embodiment of a second aspect, a method is provided for controlling a device according to the first aspect. The method comprises a step of applying, by the control unit, in a write mode electrical programming pulses to the first and the second terminal for writing a resistance state. The method comprises a further step of applying, in a read mode a read voltage to the first and the second terminal for reading the resistance state. The resistance states correspond to crystalline forms of the polymorphic material, in particular the first and the second crystalline form and distributions thereof for intermediate resistance states.

According to an embodiment of third aspect of the invention, a computer program product is provided for operating a device according to the first aspect. The computer program product comprises a computer readable storage medium having program instructions embodied therewith, the program instructions executable by the control unit of the device to cause the control unit to perform a method according to the second aspect.

Embodiments of the invention will be described in more detail below, by way of illustrative and non-limiting examples, with reference to the accompanying drawings.

DETAILED DESCRIPTION

In reference to FIGS. 1-7, some general aspects and terms of embodiments of the invention are described.

According to embodiments of the invention, a polymorphic material may be defined as a material that can exist in two or more crystalline forms, i.e. crystalline structures. Polymorphism may be found in a plurality of crystalline materials.

For an enantiotropic polymorphic material, a diagram of the Gibbs free energy over temperature shows a crossing point threshold before the various melting points. Furthermore, the crystal structure of enantiotropic polymorphic materials may be reverted interchangeably between the different crystalline forms by heating or cooling, or through physical contact with a lower energy polymorph.

Figure 1:
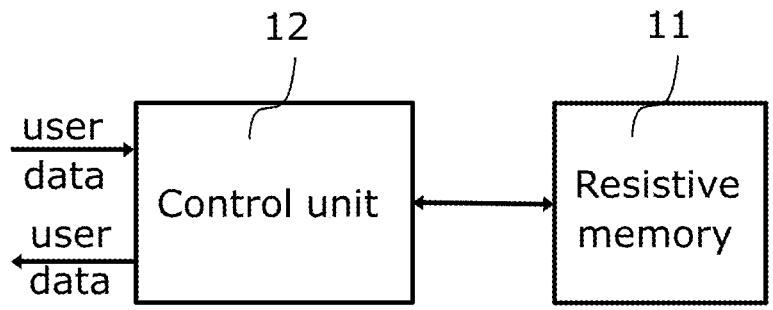
FIG. 1 illustrates a block diagram of a memory device according to an embodiment of the invention.

FIG. 1 is a simplified schematic block diagram of a memory device 10 embodying the invention. The device 10 includes a polymorphic resistive memory 11 for storing data in one or more integrated arrays of resistive memory cells described below. Reading and writing of data to memory 11 is performed by a control unit 12. Control unit 12 comprises circuitry for programming resistive memory cells during data write operations and making read measurements for detecting cell-state during data read operations. During these operations, the control unit can address individual resistive memory cells by applying appropriate control signals to an array of word and bit lines in the resistive memory 11. User data input to device 10 may be subjected to some form of write-processing, such as coding for error-correction purposes, before being supplied as write signal, in particular as write voltage, to the resistive memory 11. Similarly, read signals received from the resistive memory 11 may be processed by a read-processing module of the control unit 12, e.g. for code-word detection and/or error correction, to recover the original input user data.

The resistive memory 11 is embodied as a polymorphic phase change memory (PPCM). Accordingly the resistive memory 11 comprises a plurality of resistive cells comprising a polymorphic material as memory cells.

The resistive cells of memory 11 may store information in s=2 or in s>2 programmable resistance states, the latter providing multilevel operation. The s programmable resistance-states correspond to different relative proportions of the different crystalline states of the polymorphic material. These states may include a high-resistance, RESET state of e.g. a first crystalline state, a low-resistance, SET state of e.g. a second crystalline state, and a number of intermediate states corresponding to an increasing size of the first crystalline state and a decreasing size of the second crystalline state.

The s programmable cell-states may be defined in control unit 12 in terms of predetermined reference values, or ranges of values, of a resistance metric used for read detection. To program a cell in a write operation, control unit 12 applies e.g. a voltage, in particular a voltage pulse, to the cell via the word- and bit-lines such that the resulting programming signal sets the cell to the required state. In a read operation, a (lower) read voltage is applied to the cell and the resulting cell current is measured to obtain the resistance metric. Control unit 12 can then detect the programmed cell state by comparing the read metric with the aforementioned reference values.

Figure 2:
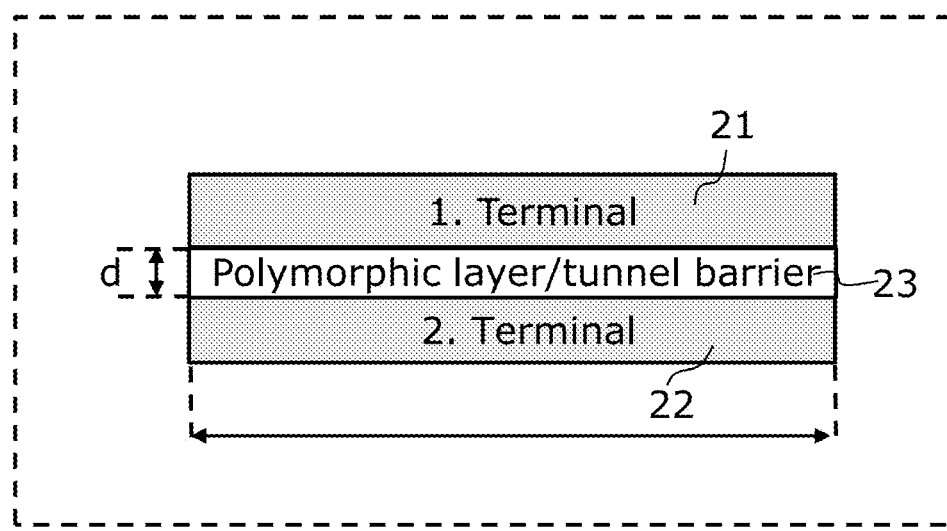
FIG. 2 shows a schematic cross sectional view of a memory cell according to an embodiment of the invention.

FIG. 2 is a schematic cross-sectional view of a resistive memory cell 20 embodying the invention. The resistive memory cell 20 comprises a first terminal 21, a second terminal 22 and a polymorphic layer 23 comprising a polymorphic material. The polymorphic layer 23 is arranged between the first terminal 21 and the second terminal 22. The polymorphic layer forms a tunnel barrier and the first terminal 21, the second terminal 22 and the polymorphic layer 23 form a tunnel junction. The first terminal 21 and the second terminal 22 comprise, in particular consist of, a metal and are hence embodied as metallic electrodes.

The polymorphic material may be a metal oxide, in particular a binary metal oxide, in particular a binary transition metal oxide. Preferred binary oxide materials include $CrO_2$, $Cr_2O_3$, $Fe_2O_3$, $Al_2O_3$, $Bi_2O_3$, $TiO_2$, $SnO_2$, $ZrO_2$, $MoO_3$, $WO_3$, $In_2O_3$ and mixtures thereof.

The polymorphic layer 23 has a thickness d of less than 20 nm in order to facilitate the establishment of the tunnel barrier.

The polymorphic layer 23 may exhibit a first crystalline form and a second crystalline form. The first crystalline form corresponds to a first resistance state and the second crystalline form corresponds to a second resistance state.

Figure 3:
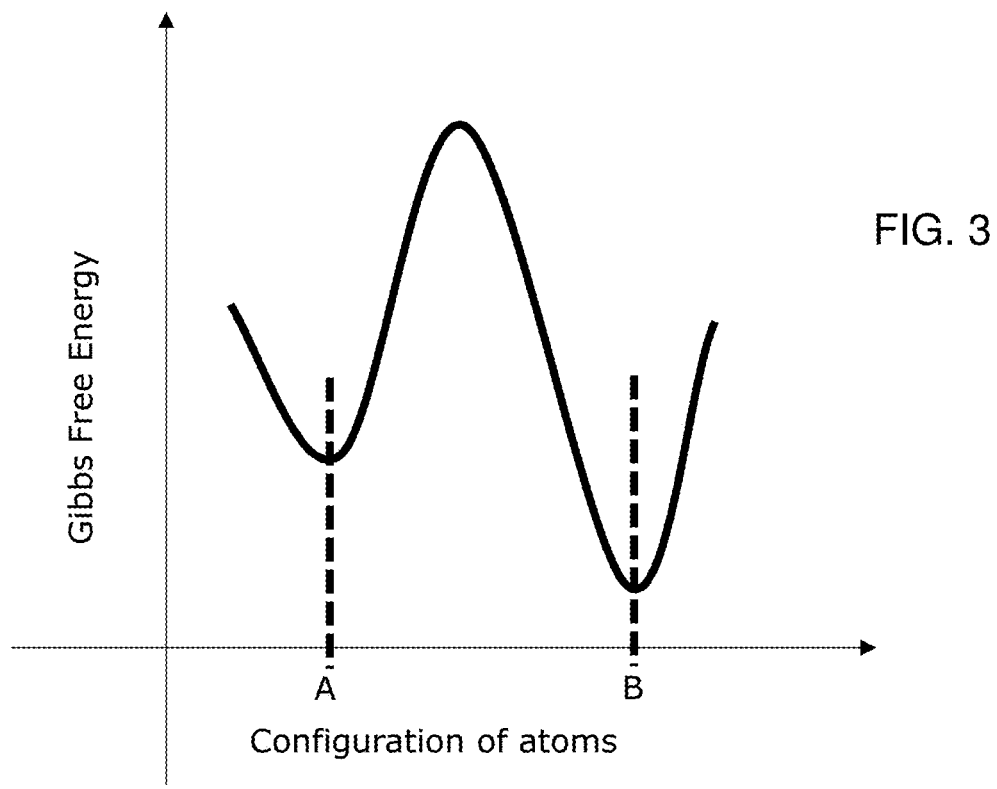
FIG. 3 illustrates a schematic variation of the Gibbs free energy of polymormic materials with the atomic configuration.

FIG. 3 illustrates a schematic variation of the Gibbs free energy with the atomic configuration of polymorphic materials according to embodiments of the invention.

More particularly, the x-axis denotes the atomic configuration and the y-axis the Gibbs free energy. According to this embodiment the polymorphic material has two atomic configurations A and B. Configuration A is a metastable state whereas configuration B has the lowest Gibbs free energy. Configuration A corresponds to a first crystalline form of the polymorphic material and configuration B to a second crystalline form. The two configurations A and B can be accessed by different heat treatments of the polymorphic materials. The heat may be applied directly or by an electrical current, in particular by applying electrical programming pulses to the polymorphic cells.

Figure 4:
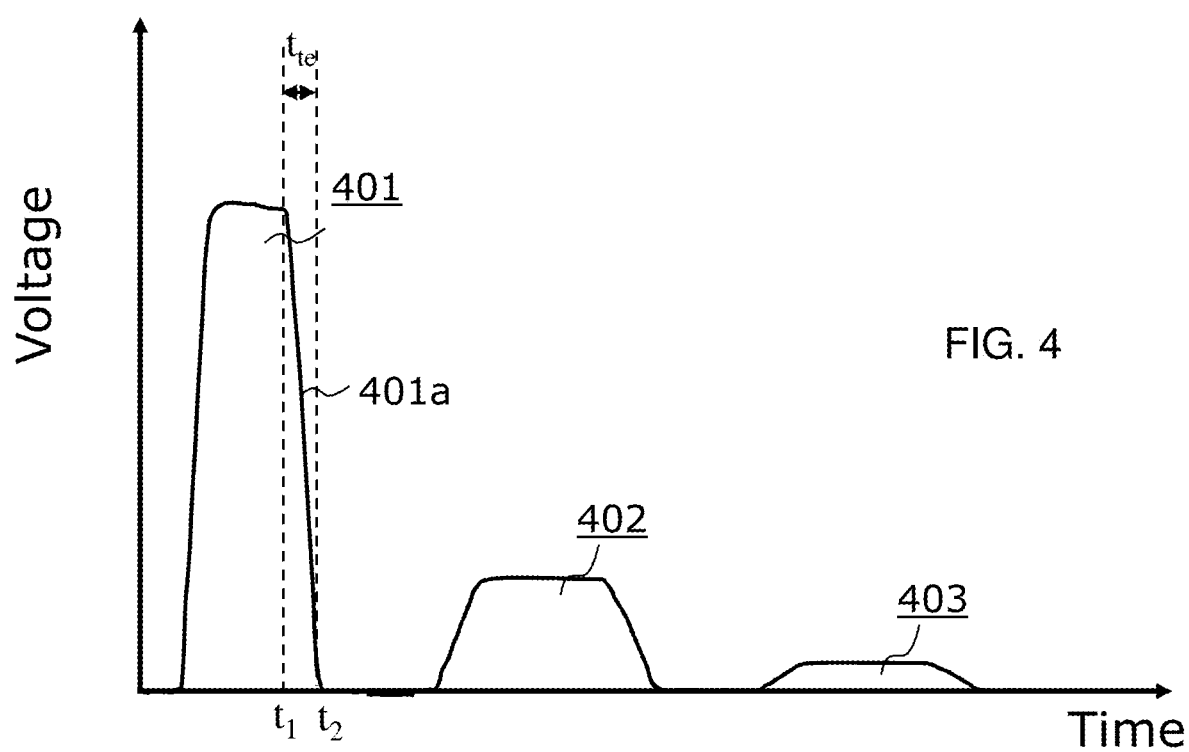
FIG. 4 illustrates a programming pulses for programming devices according to embodiments of the invention to different resistance states.

FIG. 4 illustrates electrical programming pulses for programming the resistive cells to different resistance states.

More particularly, the programming pulses shown in FIG. 4 may be applied in a write mode by the control unit 12 of FIG. 1 to the first terminal 21 and the second terminal 22 for writing a resistance state of the cells. The X-axis denotes the time and the Y-axis the voltage of the electrical programming pulses.

The electrical programming pulses comprise RESET pulses 401 to perform a transition from the first crystalline form to the second crystalline form and SET-pulses 402 to perform a reverse transition from the second crystalline form to the first crystalline form. The voltage of the RESET pulses is chosen such that it corresponds to heat being applied to the resistive cell 20 that heats the resistive cell 20 above the transition temperature from the first crystalline form to the second crystalline form. Hence the crystalline state of the memory cell 20 transitions from the first crystalline state to the second crystalline state by the application of the RESET pulse 401. The trailing edge 401a of the RESET-pulses 401 is chosen such that the associated quench-rate is sufficiently high to keep the second crystalline form and to prevent the reformation of the first crystalline form. More particularly, the trailing edge 401a has a trailing edge duration $t_{te}$ (between $t_1$ and $t_2$) that is sufficiently short to facilitate the desired quench rate. As a result, the polymorphic layer 23 is locked in its second crystalline form. The respective quench rate may be chosen in accordance with the respective material and geometry of the resistive cell 20. The SET-pulse 402 is smaller and longer than the RESET-pulse 401. Accordingly, the resistive cell is heated to a temperature which is lower than the transition temperature between the first and the second crystalline form. This reverses the transition to the second crystalline form and brings the polymorphic layer back to the first crystalline form.

According to embodiments, the lower terminal, in this example the second terminal 22, is epitaxially lattice matched to the polymorphic layer 23 in the first crystalline form. This facilitates the reversal of the transition of the polymorphic layer 23 from the second crystalline form back to the first crystalline form.

As an example, the polymorphic layer 23 may be a layer of $TiO_2$ and the second terminal 22 may be a $RuO_2$ electrode which has a Rutile crystalline form. The metal oxide $TiO_2$ at room temperature has also the Rutile crystalline form as first crystalline form, but at higher temperatures prefers the Anatase crystalline form as second crystalline form. While in bulk, the transition temperature between the Rutile crystalline form and the Anatase crystalline form of $TiO_2$ is about 800° C., in thin film polymorphic layers according to embodiments of the invention the enantiotropic transition temperature of $TiO_2$ can be can be configured to be lower. If the polymorphic $TiO_2$ layer and the corresponding tunnel barrier is heated to its transition temperature by the RESET pulse 401 and quickly quenched, the polymorphic layer 23 is locked in its Anatase crystalline form, thereby obtaining a different resistance state.

On the other hand, by applying one or more SET-pulses 402 corresponding to a lower temperature of the polymorphic layer 23, the underlayer of $RuO_2$ formed by the second terminal 22, which has a rutile crystalline form, will facilitate a transition of the polymorphic $TiO_2$ layer back into its rutile crystalline form. Thereby the resistive cell 20 reobtains its original resistance state of the first crystalline form. Accordingly, such an embodied resistive cell has two well defined crystal structures (Rutile, Anatase) that have different band gaps. More particularly, TiO2 in rutile crystalline form has a bandgap of 3.0 eV and TiO2 in anatase crystalline form has a bandgap of 3.2 eV. This results in different tunneling matrix elements and hence a different tunnel resistance and two well defined resistance/memory states.

The switching between the first crystalline form of the configuration A and the second crystalline form of the configuration B as shown in FIG. 3 is performed enantiotropically. Furthermore, the polymorphic material of the polymorphic layer 23 shows preferably a kinetically irreversible transition between the configuration A and the configuration B. With such polymorphs the stable enantiotropic form at higher temperatures is available even below the thermodynamic temperature and vice versa.

The switching characteristics of the polymorphic layer 23 of a given polymorphic material may be tuned by tuning the transition temperature, by appropriate choice of the first and the second terminals (electrodes) based on their resistivity, thermal conductivity and crystal structure as well as by changing the device geometry. For example, a TiO2 tunnel barrier grown on a rutile and metallic RuO2 electrode will lower the rutile crystalline form of TiO2. Another possibility is to use a VO2 electrode, which is metallic in its rutile form and a mott insulator in its monoclinic form with a small gap of 0.6 eV.

For reading a resistance state, the device 10 may apply a read voltage, e.g. a read pulse 403 to the first terminal 21 and the second terminal 22.

Figure 5:
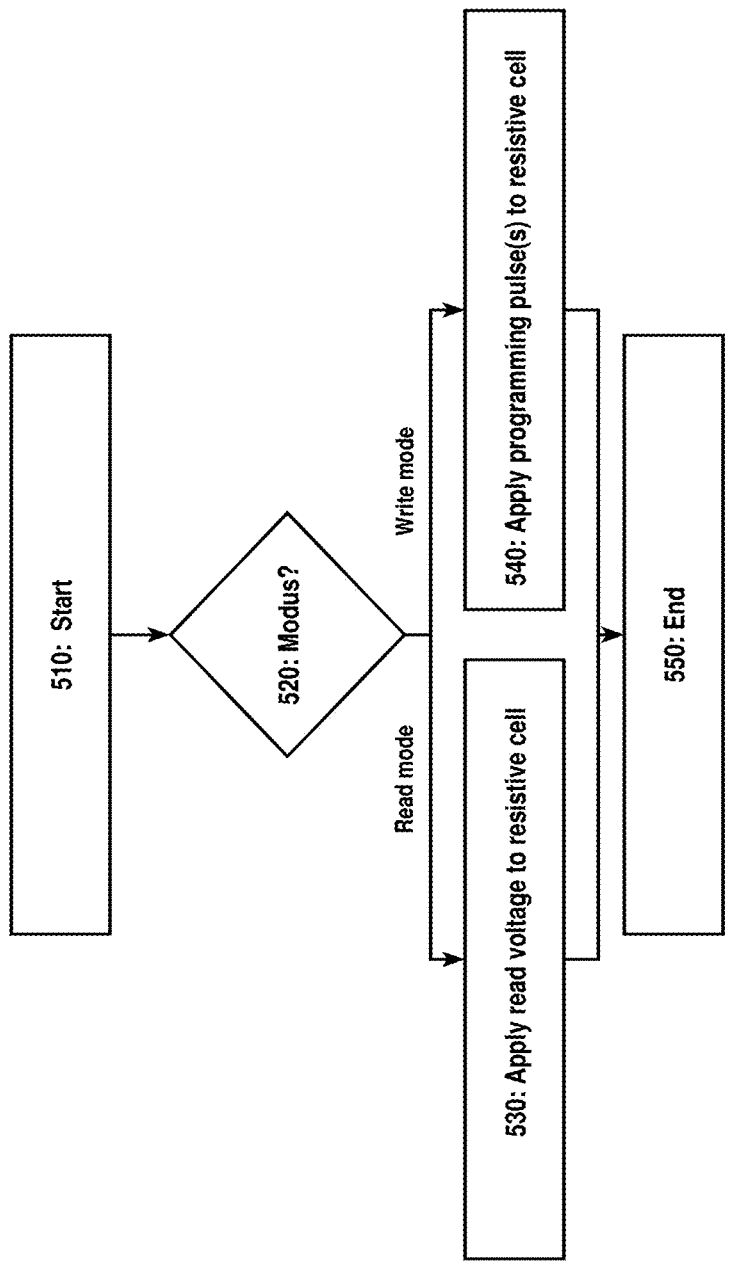
FIG. 5 illustrates method steps of a method for operating a device according to embodiments of the invention.

FIG. 5 shows a flow chart of method steps of a method for operating a memory device, e.g. the memory device 10 of FIG. 1.

At a step 510, the method is started.

At a step 520, the control unit 12 checks the mode of operation, namely whether a read operation or a write operation shall be performed.

If the device 10 shall operate in the read mode, the control unit 12 applies at a step 530 a read voltage to the first and the second terminal for reading the resistance state.

If the device 10 shall operate in the write mode, the control unit 12 applies at a step 540 one or more write voltages as electrical programming pulses to the first and the second terminal and writes thereby the resistance state of the respective memory cell.

At a step 550, the method stops and the memory device 10 may start again with step 510.

Figure 6:
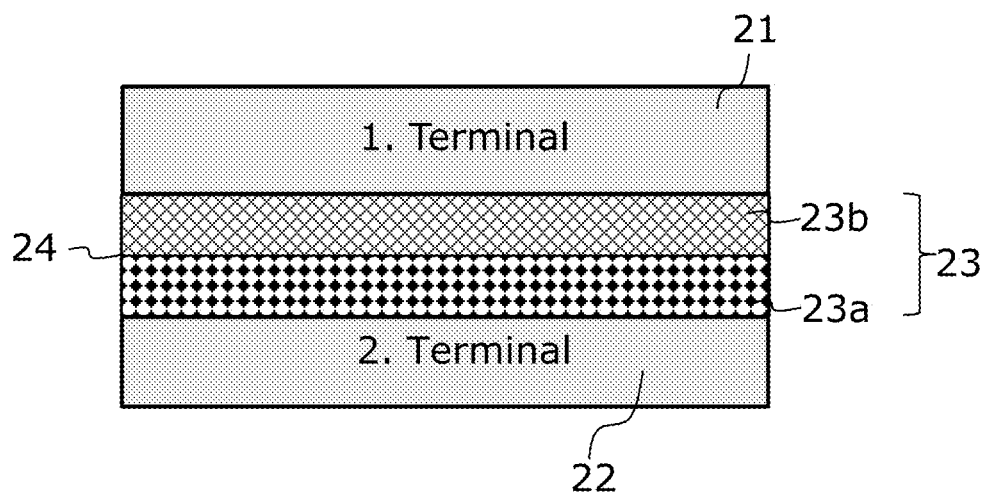
FIG. 6 shows a schematic cross sectional view of a resistive cell configured to shift a domain wall between a first crystalline form and a second crystalline form in order to tune its resistance state in a continuous manner.

FIG. 6 shows a resistive cell 20 of a device 10 according to embodiments of the invention which is configured to shift a domain wall 24 between the first crystalline form 23a and the second crystalline form 23b of a polymorphic layer 23. This allows to tune the resistance state of the cell 20 in a continuous manner. According to an embodiment, the larger the thickness of the second crystalline form 23b (having in this embodiment a higher resistance state than the first crystalline form 23a), the larger the total resistance of the polymorphic layer 23. Or according to another embodiment, the larger the thickness of the first crystalline form 23a (having in this embodiment a higher resistance state than the second crystalline form 23b), the larger the total resistance of the polymorphic layer 23.

The domain wall 24 may be shifted by applying appropriate programming pulses, in particular in an iterative manner, to the resistive cell 20.

Figure 7:
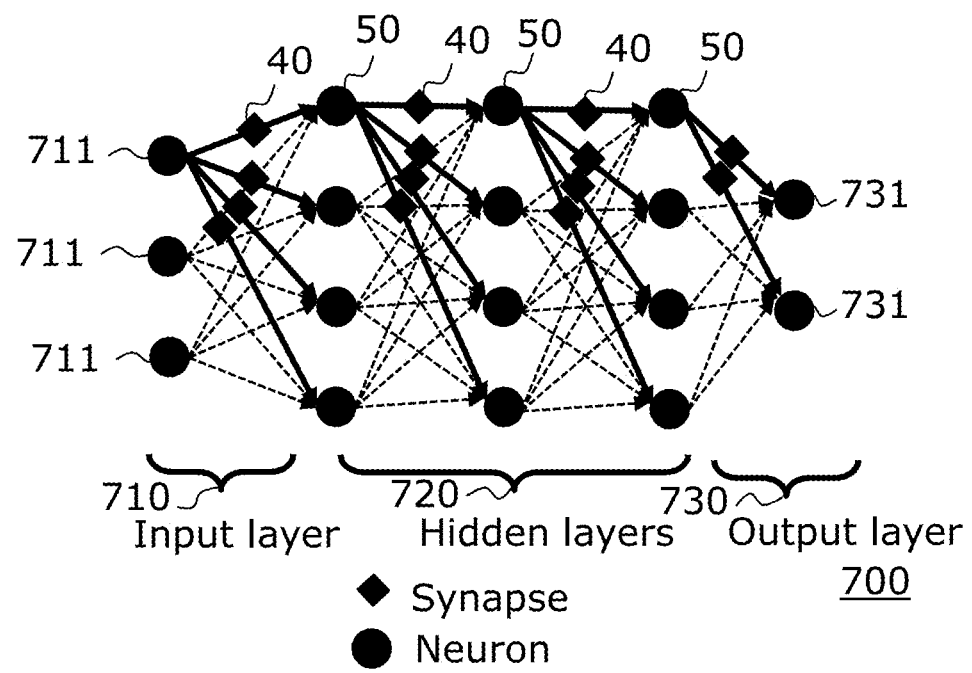
FIG. 7 shows a neuromorphic network comprising a plurality of resistive cells as synapses.

FIG. 7 shows a schematic view of a neural network 700 according to an embodiment of the invention. The neural network 700 comprises an input layer 710, a hidden layer 720 and an output layer 730. The input layer 710 comprises a plurality of input nodes 711 and the output layer 730 comprises a plurality of output nodes 731. The neural network 700 comprises a plurality of synapses 40 and a plurality of neurons 50. The synapses 40 may be implemented by resistive cells as described above, e.g. by the resistive cell 20 of FIG. 2.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Moreover, the features described may be applied to single-level as well as multi-level cells.

In general, modifications described for one embodiment may be applied to another embodiment as appropriate.

What is claimed is:

1. A device, comprising:
a control unit and a plurality of resistive cells, the resistive cells comprising:
a first terminal;
a second terminal; and
a polymorphic layer comprising a polymorphic material, the polymorphic layer being configured to form a tunnel barrier and being arranged between the first terminal and the second terminal, wherein a crystalline form of the polymorphic material is variable among at least two crystalline structures of stable lattices;
wherein the first terminal, the second terminal and the polymorphic layer form a tunnel junction.

2. The device according to claim 1, wherein the polymorphic layer is configured to exhibit a first crystalline form and a second crystalline form, the first crystalline form has a first resistance state and the second crystalline form has a second resistance state.

3. The device according to claim 2, wherein the control unit is configured to apply heat to the resistive cells in order to switch interchangeably between the first and the second crystalline form and its corresponding first and second resistance state.

4. The device according to claim 2, wherein the control unit is configured to switch enantiotropically between the first and the second crystalline form and its corresponding first and second resistance state.

5. The device according to claim 2, wherein the polymorphic material is configured to show a kinetically irreversible transition between the first and the second crystalline form.

6. The device according to claim 2, wherein at least one of the first terminal and the second terminal is epitaxially lattice matched to the polymorphic layer in the first crystalline form or the second crystalline form.

7. The device according to claim 1, wherein the first terminal and the second terminal are embodied as metallic electrodes comprising a metal.

8. The device according to claim 1, wherein the polymorphic material is a metal oxide.

9. The device according to claim 8, wherein the polymorphic material is a binary metal oxide.

10. The device according to claim 8, wherein the metal oxide is selected from the group comprising: $CrO_2$, $Cr_2O_3$, $Fe_2O_3$, $Al_2O_3$, $Bi_2O_3$, $TiO_2$, $SnO_2$, $ZrO_2$, $MoO_3$, $WO_3$, $In_2O_3$ and mixtures thereof.

11. The device according to claim 1, wherein the control unit is configured to apply in a write mode electrical programming pulses to the first terminal and the second terminal for writing a resistance state of the resistive cells.

12. The device according to claim 11, wherein:
the electrical programming pulses comprise:
RESET pulses to perform a transition from the first crystalline form to the second crystalline form; and
SET-pulses to perform a transition from the second crystalline form to the first crystalline form.

13. The device according to claim 1, wherein the device is configured to apply in a read mode a read voltage to the first and the second terminal for reading a resistance state of the cells.

14. The device according claim 2, wherein the device is configured to shift a domain wall between the first crystalline form and the second crystalline form in order to tune a resistance state of the cells in a continuous manner.

15. The device according to claim 1, wherein the polymorphic layer has a thickness of less than 20 nm.

16. The device according to claim 1, wherein the device is a memory device.

17. A neuromorphic network comprising a device according to claim 1.

18. A method for operating a device, the device comprising:
a control unit for controlling the device; and
a plurality of resistive cells, the resistive cells comprising:
a first terminal;
a second terminal; and
a polymorphic layer comprising a polymorphic material, the polymorphic layer being configured to form a tunnel barrier and being arranged between the first terminal and the second terminal, wherein a crystalline form of the polymorphic material is variable among at least two crystalline structures of stable lattices;
the method comprising:
applying, by the control unit, in a write mode electrical programming pulses to the first and the second terminal for writing a resistance state; and
applying, by the control unit, in a read mod; a read voltage to the first and the second terminal for reading the resistance state; wherein the resistance state corresponds to crystalline forms of the polymorphic material.

19. The method according to claim 18, further comprising configuring the polymorphic layer to exhibit a first crystalline form and a second crystalline form, the first crystalline form having a first resistance state and the second crystalline form having a second resistance state.

20. A computer program product for operating a device according to claim 1, the computer program product comprising a computer readable storage medium having program instructions embodied therewith, the program instructions executable by the control unit of the device to cause the control unit to perform a method comprising:
applying, by the control unit;
in a write mod; electrical programming pulses to the first and the second terminal for writing a resistance state; and
in a read mod; a read voltage to the first and the second terminal for reading the resistance state; wherein the resistance state corresponds to crystalline forms of the polymorphic material.

* * * * *